(12) United States Patent
Woo et al.

(10) Patent No.: US 6,349,050 B1
(45) Date of Patent: Feb. 19, 2002

(54) METHODS AND SYSTEMS FOR REDUCING HEAT FLUX IN MEMORY SYSTEMS

(75) Inventors: Steven C. Woo, Saratoga; Craig E. Hampel, San Jose, both of CA (US)

(73) Assignee: Rambus, Inc., Los Altos, CA (US)

( * ) Notice: Subject to any disclaimer, the term of this patent is extended or adjusted under 35 U.S.C. 154(b) by 0 days.

(21) Appl. No.: 09/686,744

(22) Filed: Oct. 10, 2000

(51) Int. Cl.[7] .................................................. G11C 5/02
(52) U.S. Cl. ........................................ 365/51; 365/226
(58) Field of Search ............................. 365/51, 52, 63, 365/226

(56) References Cited

U.S. PATENT DOCUMENTS

| | | | | |
|---|---|---|---|---|
| 5,619,471 A | * | 4/1997 | Nunuziata | 365/230.03 |
| 5,805,520 A | * | 9/1998 | Anglada et al. | 365/230.02 |
| 5,978,304 A | * | 11/1999 | Crafts | 365/230.03 |
| 6,049,476 A | * | 4/2000 | Laudon et al. | 365/52 |

\* cited by examiner

*Primary Examiner*—David Nelms
*Assistant Examiner*—Thong Le
(74) *Attorney, Agent, or Firm*—Lee & Hayes, PLLC

(57) ABSTRACT

Systems and methods for reducing heat flux in memory systems are described. In various embodiments, heat flux reductions are achieved by manipulating the device IDs of individual memory devices that comprise a memory module. Through the various described techniques, the per-face heat flux can be desirably reduced. Further, in some embodiments, reductions in heat flux are achieved by providing control lines that operably connect memory devices on different faces of a memory module.

44 Claims, 10 Drawing Sheets

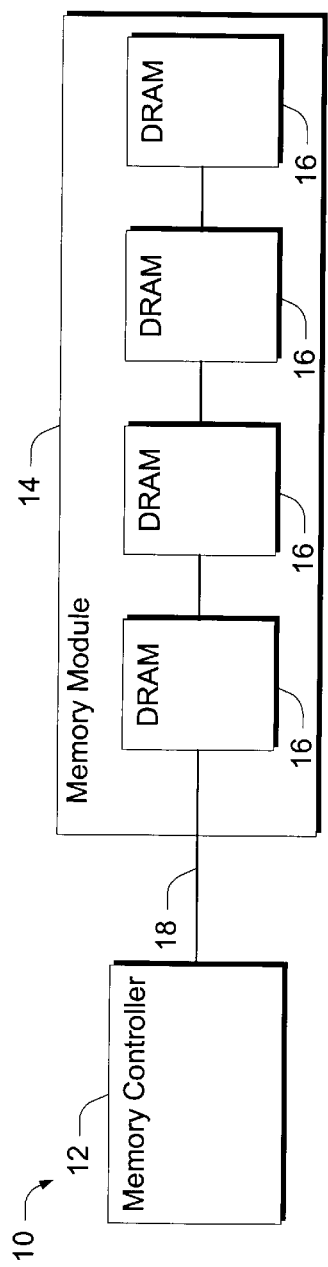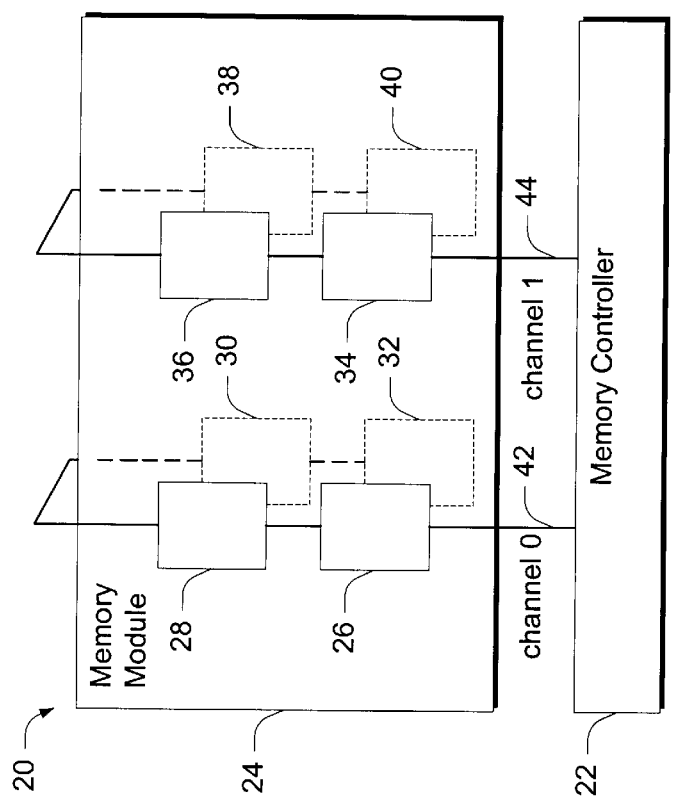

METHODS AND SYSTEMS FOR REDUCING HEAT FLUX IN MEMORY SYSTEMS

TECHNICAL FIELD

This invention relates to methods and systems for reducing heat flux in memory systems.

BACKGROUND

During the last two decades, DRAM technology has progressed dramatically. Device densities have increased from 1 Kbit per chip to 64 Mbits per chip, a factor of 64,000. DRAM performance has not kept pace with these density changes, since access times have decreased by about a factor of 5. Over the same 20 year period, microprocessor performance has jumped by several orders of magnitude. This growing disparity between the speed of microprocessors and that of DRAMs has forced system designers to create a variety of complicated and expensive hierarchical memory techniques, such as SRAM caches and parallel arrays of DRAMs. In addition, now that users demand high performance graphics, systems often rely on expensive frame buffers to provide the necessary bandwidth. And, due to the density increases in DRAMs, this need for bandwidth is required from fewer total chips.

To address this processor-to-memory performance gap, Rambus Inc., the assignee of this document, has developed a revolutionary chip-to-chip bus, termed the "Direct Rambus Channel", that operates up to 10 times faster than conventional DRAMS. The Direct Rambus Channel connects memories to devices such as microprocessors, digital signal processors, graphics processors, and ASICs. The Channel uses a small number of very high speed signals to carry all address, data, and control information. Because it is able to transfer data at 1.6 Gbytes per second at a moderate cost, the Direct Rambus Channel is ideal for high performance/low cost systems.

FIG. 1 shows an exemplary memory system generally at 10. System 10 typically includes a memory controller 12, one or more memory module boards 14 that support multiple DRAM devices 16 (or "RDRAMs" for "Rambus DRAMs"). The memory controller 12 and the DRAM devices 16 are connected together by a high speed bus 18. The memory module(s) 14 is supported by a motherboard (not shown) that enables the high speed bus 18 to be routed to other memory modules that might be supported by the motherboard.

In order to allow lower power system operation, the RDRAM has several operating modes: Active, Standby, Nap, and Powerdown. The four modes are distinguished by two factors, their power consumption, and the time that it takes the RDRAM to execute a transaction from that mode.

In Active mode, the RDRAM is ready to immediately service a transaction. Power consumption is also higher in Active mode than in the other three modes. Unlike conventional DRAM memory systems, where each device in an entire bank of memory must consume Read/Write power through an entire access, Rambus memory systems use only one device to perform the Read or Write transfer, while the others revert to a lower power state. In the FIG. 1 example, only one of the RDRAMs 16 is ever actively reading or writing at one time.

Standby mode consumes less power than Active mode. Devices that are not involved in a transaction may be placed into a Standby mode by the memory controller to reduce power consumption. If an RDRAM is in Standby mode and is involved in a transaction, it must first transition to Active mode before it can service the transaction. An RDRAM may be instructed to transition to Standby mode at the end of a transaction.

Power consumption can be reduced by placing one or more RDRAMs into Nap mode. Nap mode uses less power than Standby mode, but it takes more time to transition to the Active mode from Nap mode than from Standby mode. Systems can achieve a large power savings by keeping the RDRAMs in Nap mode whenever they are not performing a Read or Write transaction. Power can further be reduced by placing one or more RDRAMs into Powerdown mode. Powerdown mode uses less power than Nap mode, but it takes more time to transition to the Active mode from Powerdown mode than from Nap mode.

An example of where these modes can be used is in a portable computer application. Here, power consumption can be reduced by placing a majority of the RDRAMs in Powerdown, while the RDRAM(s) that contain the frame buffer is placed in either Standby or Nap mode. This permits screen refresh to occur without powering up the entire memory system.

Because of the nature of the operation of the system described above (i.e. only one RDRAM is ever actively reading or writing at a particular instant in time), localized hot spots can develop on the memory module. It is desirable to dissipate this heat because of the adverse impact it can have on a memory system. Many techniques exist to dissipate heat including active techniques, such as the use of fans, and passive techniques such as the use of aluminum heat spreaders. As the push toward higher bandwidths continues, memory systems are going to have to be designed that not only meet the bandwidth requirements, but also operate well within desired tolerances are far as power dissipation and heat flux are concerned.

Accordingly, this invention arose out of concerns associated with providing improved methods and systems that provide high bandwidth memory systems with reduced heat flux.

SUMMARY

Methods and systems for reducing heat flux in memory systems are described.

In one embodiment, a memory module comprises one or more faces and multiple channels on one or more of the faces. Multiple memory devices are disposed on each channel, with the memory devices being configured for operation in lock-step. Device IDs for each device are assigned and arranged so that power dissipation and hence heat flux per face is minimized.

In another embodiment, one or more memory modules each comprise one or more faces and multiple channels on one or more of the faces. Multiple DRAM devices are disposed on each channel, with the DRAM devices being configured for operation in lock-step. Device IDs for each DRAM device are assigned, with corresponding DRAM devices on different channels having the same device ID. The device IDs are arranged so that no two DRAM devices have the same device ID on any one face.

In yet another embodiment, one or more memory modules each comprise one or more faces and multiple channels on one or more of the faces. Multiple DRAM devices are disposed on each channel, with the DRAM devices being configured for operation in lock-step. Device IDs are assigned for each DRAM device, with corresponding DRAM devices on different channels having the same device ID. The device IDs are arranged so that the physical distance between corresponding devices is maximized.

In a further embodiment, a memory module comprises one or more faces and multiple channels on one or more of the faces. Multiple memory devices are disposed on each channel, with the memory devices being configured for operation in lock-step. Device IDs are assigned for each memory device, with corresponding memory devices on different channels having the same device ID. There are enough memory devices so that at least one pair of corresponding devices have to appear on the same face of the module. Device IDs are arranged so that the physical distance between corresponding devices on a face is maximized.

In yet another embodiment, a memory module comprises front and back faces, and multiple devices on each face. A control line is provided and connects devices on each of the faces so that the connected devices commonly contribute multiple bits to a data bus.

BRIEF DESCRIPTION OF THE DRAWINGS

FIG. 1 is block diagram of an exemplary memory system in accordance with the prior art.

FIG. 2 is a block diagram of a memory system in accordance with one or more of the described embodiments.

DETAILED DESCRIPTION

Overview

Figure 2A:
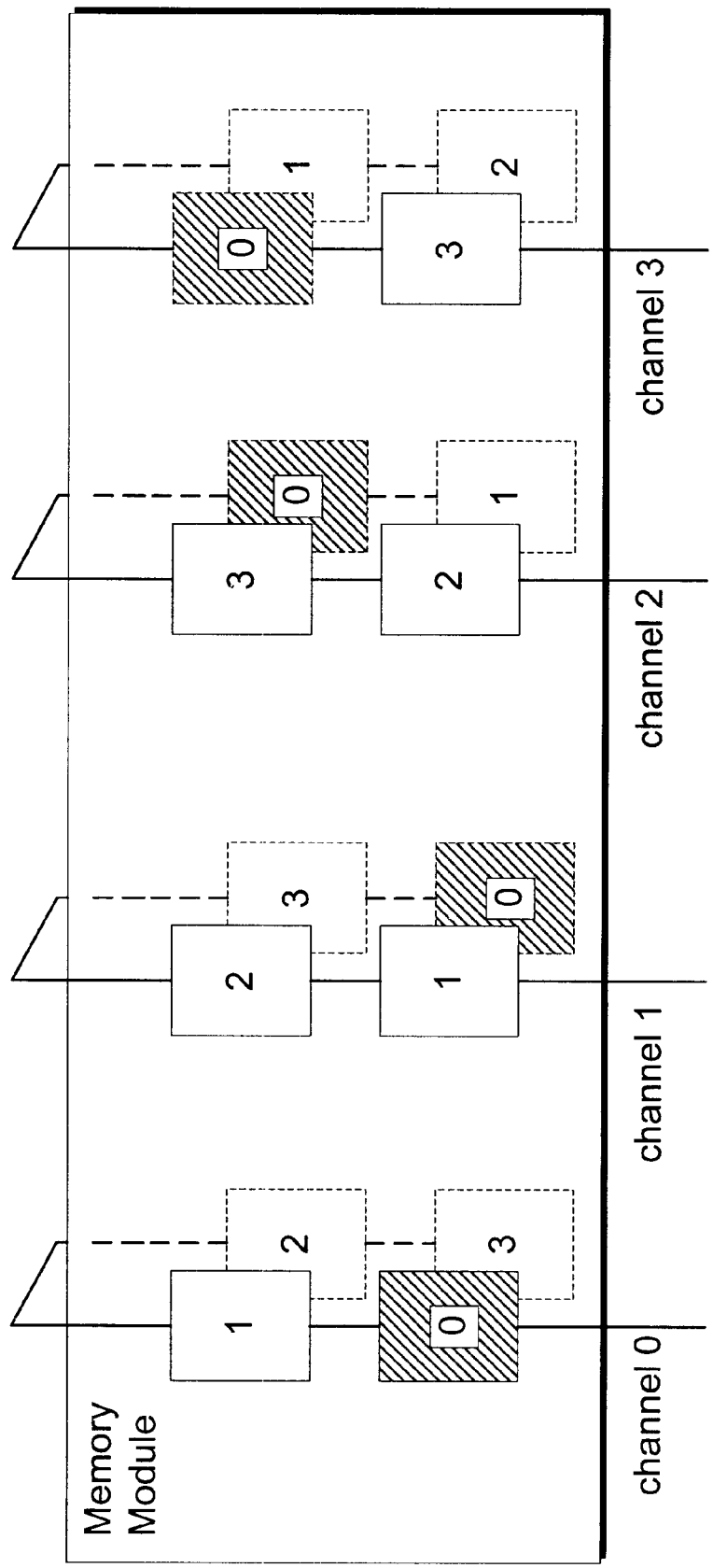
FIG. 2A is a block diagram of a memory system in accordance with one or more of the described embodiments.

Systems and methods for reducing heat flux in memory systems are described. In various embodiments described below, heat flux reductions are achieved by manipulating the device IDs of individual memory devices that comprise one or more memory modules. As will be seen, through the various described techniques, the heat flux can be desirably reduced. Further, in some embodiments, reductions in heat flux are achieved by providing control lines that operably connect memory devices on different faces of a memory module.

Increasing Bandwidth

FIG. 2 shows an exemplary memory system 20 that has desirably increased bandwidth over the system of FIG. 1. System 20 includes a memory controller 22 and a memory module 24. The memory module 24 comprises a support substrate which, in this example, comprises a printed circuit board. Other substrates can, of course, be used. Module 24 includes multiple channels each with multiple devices thereon. In this particular example, RDRAM devices 26, 28, 30, and 32 are provided and comprise a first channel along a bus 42. Devices 26, 28 are supported by a first face of module 24, and devices 30, 32 are supported by a second face of module 24. RDRAM devices 34, 36, 38, and 40 are also provided and comprise a second channel along a bus 44. Devices 34, 36 are supported by the first face of module 24, and devices 38, 40 are supported by the second face of module 24. In this example, each channel provides 1.6 GB/sec of bandwidth, thus effectively doubling the bandwidth of the system that is shown in FIG. 1. It will be appreciated that multiple memory modules, such as the one shown in FIG. 2, can be used in various systems so that channels route on and off of the modules. In those embodiments, heat flux-reducing steps can be taken, as described below, that are similar to or analogous to those that take place with a single memory module, as will be appreciated and understood by those of skill in the art.

Several terms that will be used throughout this document are defined as follows. A "channel" is a data bus composed of one or more wires that connect to one or more devices. The Direct Rambus channel is 16 or 18 bits wide. Other differently configured channels are possible. Multiple channels can be operated in parallel to increase the width of the datapath between the memory controller and the RDRAMs. This datapath is said to be operated in "lockstep" when devices on different channels are given commands at substantially the same time. The phrase "substantially the same time" is used to indicate that the commands (and likewise data) traveling on each channel may or may not be synchronized across the channels. That is, there may be some timing differences between when commands (and likewise data) are transmitted on each channel. In memory systems that use Direct RDRAMs, each RDRAM on a channel has a unique device ID, and commands contain the device ID of the RDRAM for which the commands are intended. Lockstep operation can be illustrated as follows. Suppose that a memory system is composed of two Rambus channels, each with 8 RDRAMs and whose device IDs are numbered 0 through 7. Lockstep operation can be achieved by sending the same command (with the same device ID specified in each command) on both channels at substantially the same time, so that one device on each channel responds.

Throughout this application, the term "corresponding devices" is used to describe a set of devices that are operated in lockstep. In the examples that follow, the corresponding devices will all reside on the same module for illustrative purposes. However, there is no reason that corresponding devices cannot reside on multiple modules (when channels span multiple modules) so that heat flux can be spread across the largest possible space. The method for controlling these corresponding devices can be different depending on the memory system architecture. In this application, there are three different methods for controlling corresponding devices. In the first scenario, multiple channels of RDRAMs are in use, and the channels are operated in lockstep by simultaneously sending the same command (with the same device ID) on each channel. The device that responds on each channel has the same device ID, since the same command is sent down each channel. In this scenario, devices with the same device ID are corresponding devices. This scenario is illustrated in FIG. 2A.

There, the same command is sent to device ID 0 on all four channels, and all four devices with device ID=0 respond to the command. In this scenario, the four RDRAMs with device ID=0 are corresponding devices.

Figure 2B:
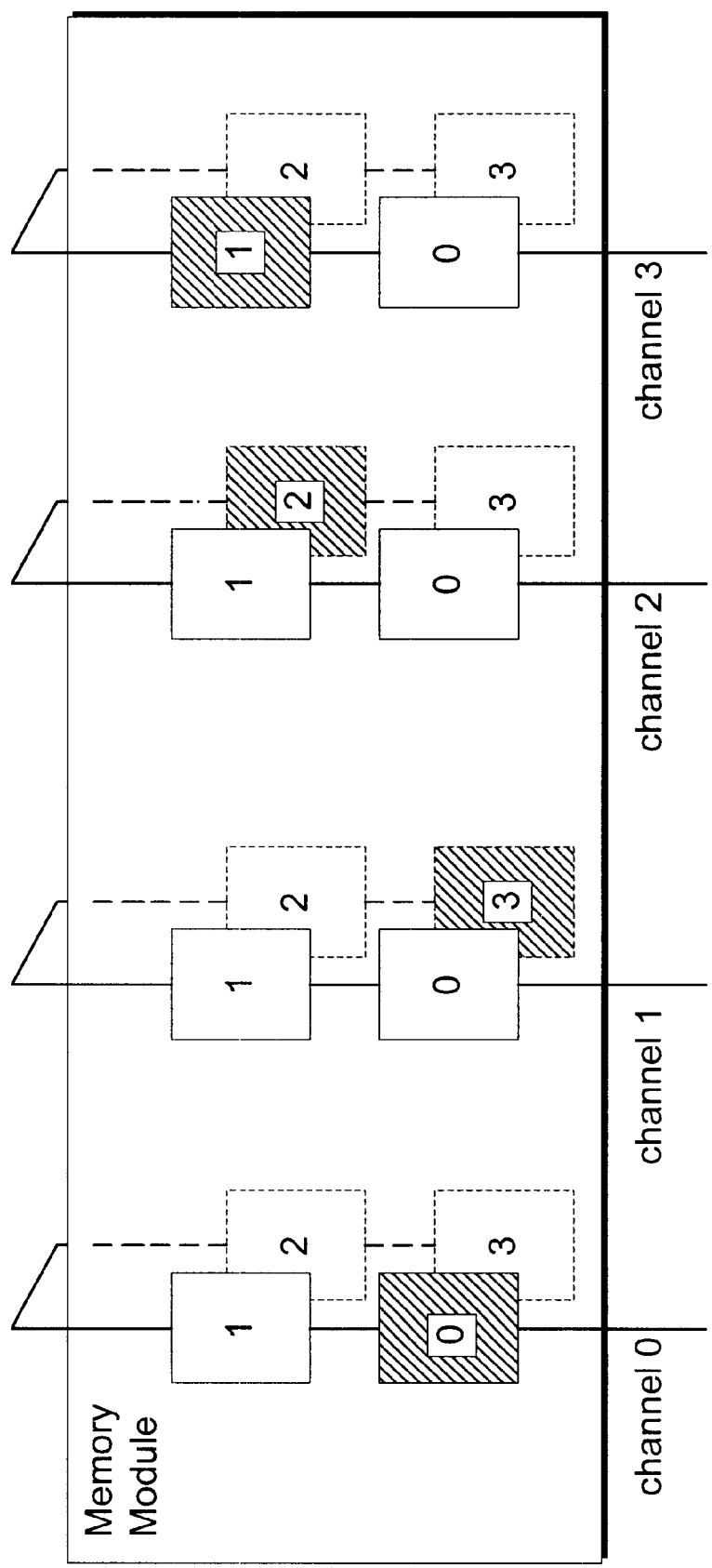
FIG. 2B is a block diagram of a memory system in accordance with one or more of the described embodiments.

In the second scenario, multiple channels of RDRAMs are in use, and the channels are operated in lockstep by simultaneously sending a command on each channel that differs only in which device ID is to respond to the command. The memory controller is responsible for managing which device IDs are specified in the commands sent on each channel. In this scenario, devices on each channel that respond to the same command are corresponding devices. This scenario is illustrated in FIG. 2B. There, similar commands, that differ only in which device ID is to respond to the command, are sent simultaneously to different device IDs on all four channels. On each channel, the proper device responds to the command. In this scenario, the four cross-hatched RDRAMs are corresponding devices.

Figure 2C:
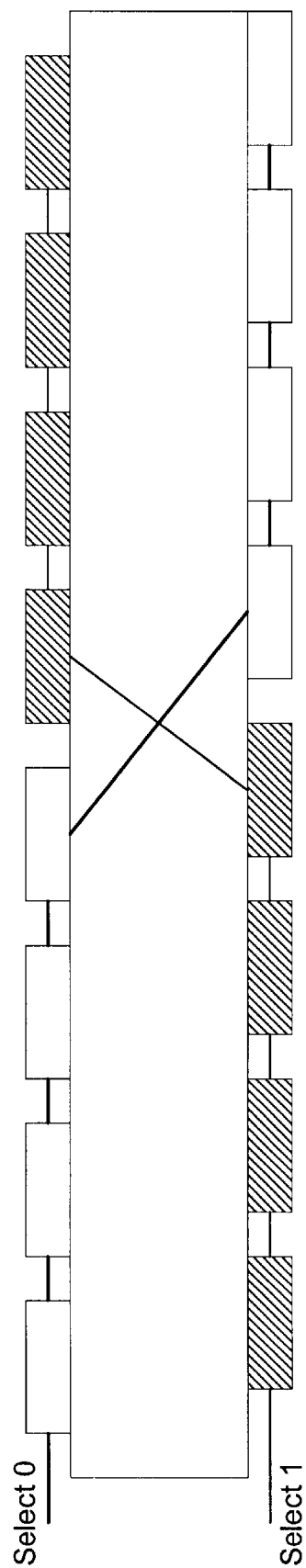
FIG. 2C is a block diagram of a memory system in accordance with one or more of the described embodiments.

Similarly, in an exemplary SDRAM system, multiple devices, e.g. 8 devices, are grouped in parallel, with each device providing 8 bits of data, to provide the 64-bit data path to the memory controller. If all 8 of these devices are accessed at substantially the same time, with the same command, they are considered "lock step". In this scenario, the devices that respond to a command, as a group, are considered corresponding devices. Typically, this is done by using a single "chip select" signal connected between the devices grouped to make up the larger data path. This scenario is illustrated in FIG. 2C, which is a top-view of a DIMM module. The module has 2 ranks of 8 devices, which is typical of today's DIMM modules. Each device is a x8 DRAM, with the module capable of reading/writing 64 bits of data at a time. In this example, all devices connected to a common select line respond to a command. In this scenario, the 8 cross-hatched devices that respond as a group are corresponding devices.

Lock Step Example With Heat Flux Calculation

Consider again the FIG. 2 device that is operated in lock step. In lock-step, devices 26 and 34 might be initialized as "device 0", devices 28 and 36 might be initialized as "device 1", devices 30 and 38 might be initialized as "device 2", and devices 32 and 40 might be initialized as "device 3." If the devices are initialized in this manner, the worst case per-side (or per-face) heat flux can be calculated as follows. The worst case occurs when all bandwidth is supplied by the devices on one side of the module. Using power values representative of current, state-of-the-art DRAMs, if each of the two devices on the same channel (26 and 28 on channel 0) on the front face is supplying 800 MB/sec, the power dissipation in the worst case is: 0.5 W for interface power, 0.25 W for RAS power, 0.25 W for CAS power and 0.25 W for I/O power. Each of the two devices dissipates 1.25 W, for a total of 2.5 W per channel. Since there are two channels (channel 0 and channel 1), the worst case power dissipation per-face is 2.5 W*2=5 W. Note that in this case, the other two devices on each channel on the back-side of the module (devices 30 and 32 on channel 0) are only dissipating 0.5 W each, so the power on the back face of the module is 4*0.5=2 W. In this case, the power dissipation is unbalanced, with 5 W on the front face and 2 W on the back face.

In accordance with one embodiment, devices on one or more memory modules are provided with device IDs in a manner such that corresponding devices on different channels have the physical space between them maximized. Where multiple memory modules are employed, this can entail providing corresponding devices on different modules. In a single module example, this can take place by ensuring that the corresponding devices are disposed on different sides of the memory module. In one preferred embodiment, each of the corresponding devices on a channel is on a different side of the memory module.

Figure 3:
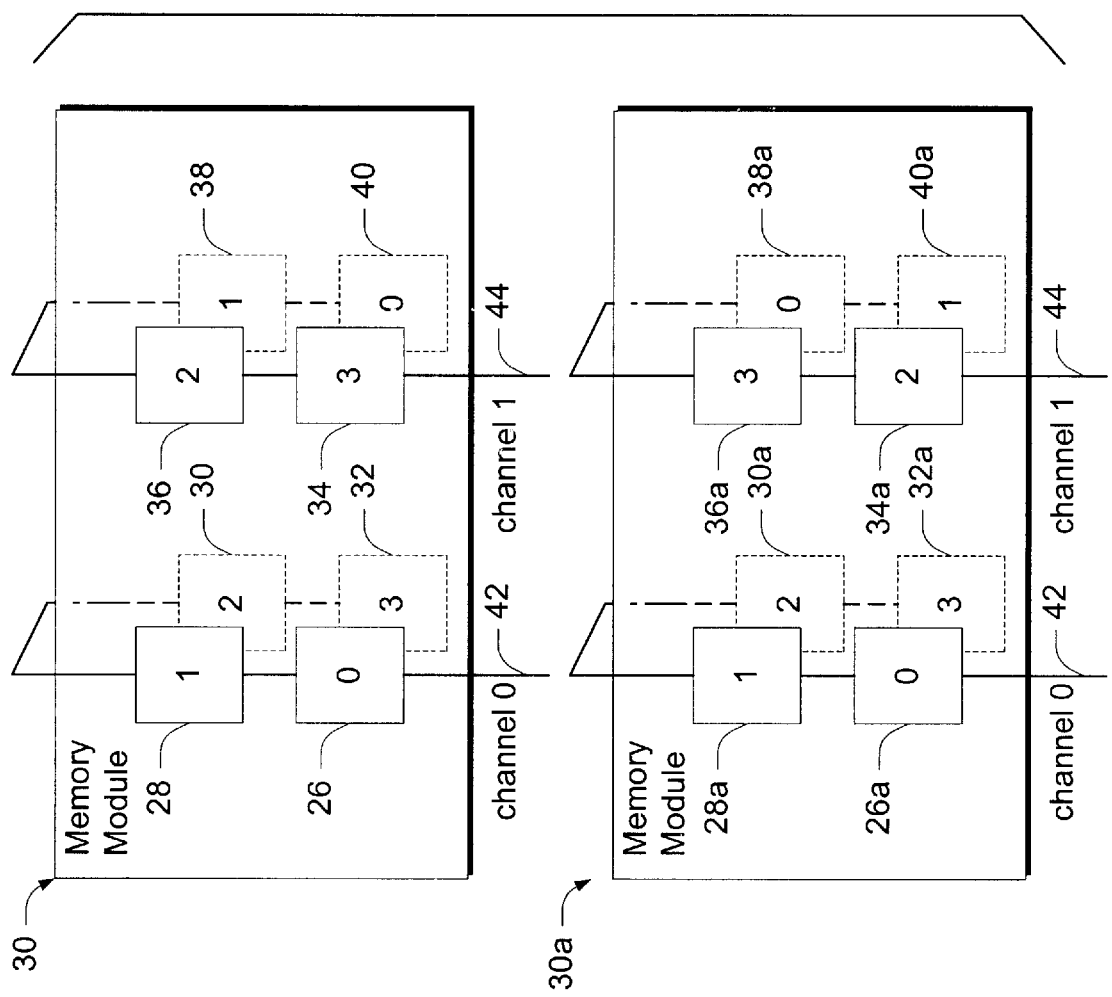
FIG. 3 is a block diagram of memory modules in accordance with one or more of the described embodiments.

Consider, for example, FIG. 3 where like numerals from FIG. 2 are utilized where appropriate. A memory module 30 is shown with two channels 42, 44 each of which contain four devices. In this example, each device is designated with its device ID. Notice that each of the devices has an ID that is different from any other device that is disposed on the same side of the module. For example, device 26 on the front side of the module has a device ID of 0. Its corresponding device is device 40 on the back side of the module. Similarly, device 28 on the front side of the module has a device ID of 1. Its corresponding device is device 38 which is disposed on the back side of the memory module. Consider now that if commands are sent to the channels so that the devices with device IDs of 0 and 1 on each channel supply all of the bandwidth, the devices will be on the front side for channel 42, and the back side for channel 44. This distributes the power more evenly, reducing the worst-case heat flux when the devices are operated in lockstep. In this case, the worst case heat flux is when all four devices on a channel supply maximum bandwidth (400 MB/sec each). The worst case power per device is 0.5 W for interface power, 0.125 W for RAS power, 0.125 W for CAS power, and 0.125 W for I/O power, or 0.875 W each. Since there are two devices per face on each channel the worst case power for each face is 3.5 W. Note that in this simple example, both faces dissipate 3.5 W, so the total module power is still the same as before (7 W), but the maximum heat flux is reduced. Note also that non-linearities in power dissipation and its effect on temperature increase may make it such that renumbering the devices dramatically reduces the total temperature rise.

Consider also, memory module 30*a*. Here, not only are the device IDs for corresponding devices separated on different sides of the module, but the physical distance between the corresponding devices is maximized to the extent possible. For example, notice that device 26*a* has a device ID of 0. Its corresponding device is device 38*a* which is on the back side of the module on the upper right corner (as viewed in the figure). Thus, corresponding devices are physically separated on the module as far as possible from one another.

One of the reasons why this arrangement of devices is important and useful is as follows. When a PC manufacturer or a system manufacturer designs a chassis, much effort is spent ensuring that the systems do not overheat. Manufacturers and designers spend a great deal of time attempting to figure out the maximum heat flux of the module. This influences things such as a system's cooling needs and the spacing between modules. These, in turn, have implications for the overall price of the system. Depending on the intended use of the system (e.g. a high-end server), this implication can save a lot of money by, for example, cutting down on the cooling requirements. Thus, by arranging the device IDs on a memory module as discussed above, the heat flux can be reduced. This is highly desirable because systems, such as the ones described above, are designed for the worst case. The inventive approach can thus lead to tighter spacing between modules and smaller board areas.

Figure 3A:
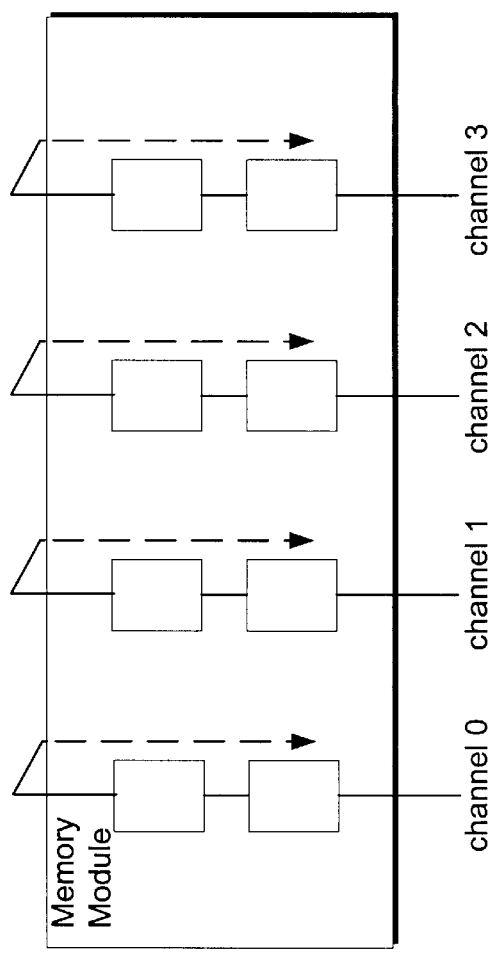
FIGS. 3A and 3B show block diagrams of memory modules in accordance with one or more of the described embodiments.
Figure 3B:
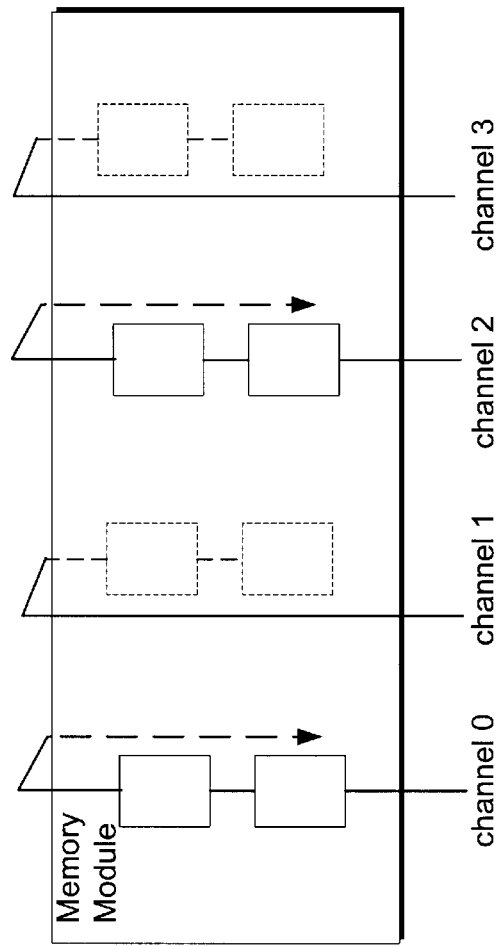

FIGS. 3A and 3B show an alternate "low capacity" embodiment in which all of the devices need not necessarily be positioned on the same side or face of a module. For example, FIG. 3A shows a four-channel memory module where each channel has two devices. In accordance with the heat flux-reducing inventive approach described above, devices for some of the channels can be placed on the other side or face of the memory module. One way of doing this is shown in FIG. 3B. There, the devices for channels 1 and 3 are disposed on the opposite side or face of the memory module.

Exemplary Method

Figure 4:
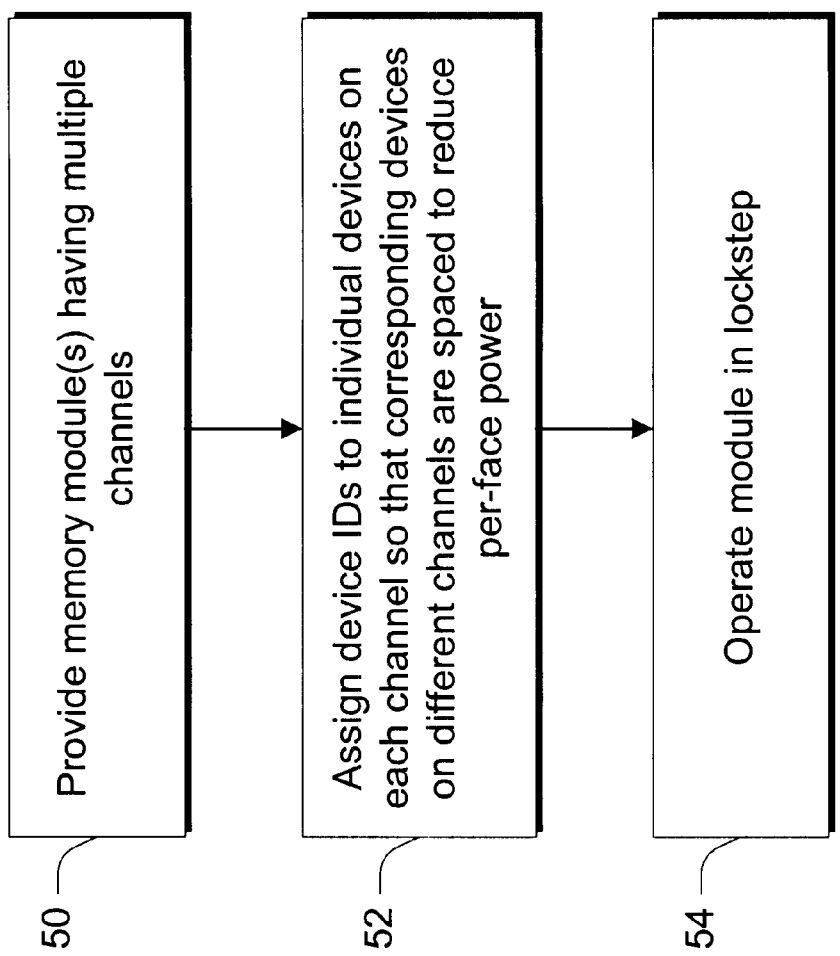
FIG. 4 is a flow diagram that describes steps in a method in accordance with the described embodiment.
Figure 5:
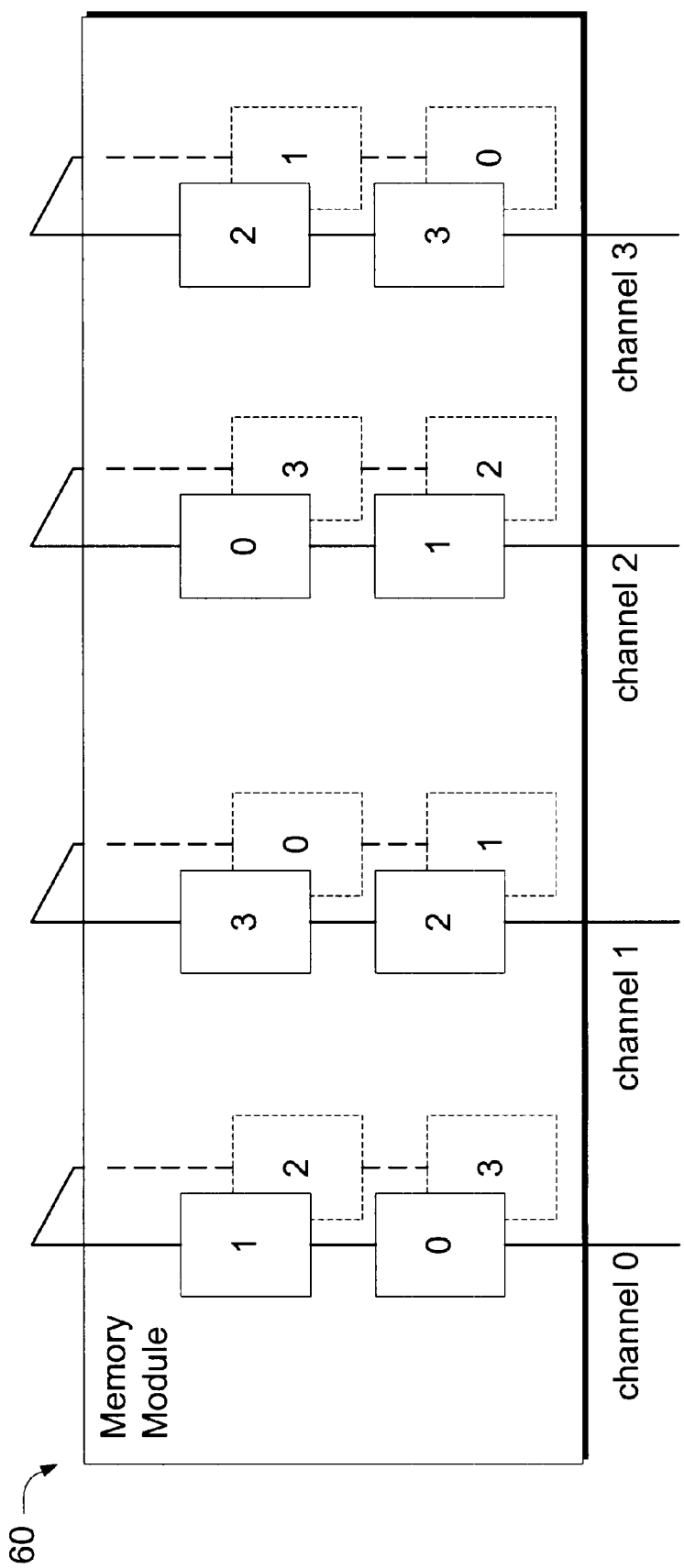
FIG. 5 is a block diagram of a memory module in accordance with one or more of the described embodiments.

FIG. 4 is a flow diagram that describes steps in a method in accordance with the described embodiment. Step 50 provides one or more memory modules each having multiple channels. A module can have any suitable number of channels. Each channel typically contains multiple memory devices, such as RDRAMs, that can, but need not be arranged on both the front and back sides of the module. It is possible, though, for the memory devices to be disposed on only one side of the memory module. Step 52 assigns device IDs to the individual devices on each channel so that corresponding devices on different channels are spaced to reduce the heat flux. In one embodiment, this is done by assigning device IDs other than the per-channel serial approach that has been used in the past. One way of doing this is to make sure that corresponding devices, as indicated by their device IDs, appear on different sides of the memory module. Another way of doing this is to ensure that corresponding devices are physically separated on the module as far apart as possible. The latter approach can be employed when, for example, the devices are disposed on only one side of a module. This approach can also be employed when it is physically impossible to place all of the corresponding devices on different sides of the module. An example of this is given below in connection with FIG. 5.

The device IDs can be assigned in any suitable way. For example, device IDs are typically assigned by the memory controller at initialization time. In the present examples, this need not be the case. For example, the device IDs might be assigned by some other component in the system or permanently assigned when the memory modules are manufactured. Accordingly, it will be appreciated that the assignment of device IDs need not be done by the memory controller.

After the device IDs are assigned, step 54 operates the module in lock-step to provide increased bandwidth.

As alluded to above, there are some memory module constructions in which it is impossible to ensure that all of the corresponding devices are arranged on different sides of the memory module. Consider, for example, FIG. 5 which shows a four-channel device. Here, each channel contains four devices. The device IDs for each of the devices are shown. In this example, since there are four devices on each channel, there will be four device IDs, namely 0 through 3. Channels are operated in lock-step so that the memory module can be operated in lock-step. If this memory module were to be assigned device IDs in the conventional manner, then each of the first devices on a channel would be initialized as device 0, the next device would be initialized as device 1, and so on. Here, however, the devices each have IDs that are assigned so that the per side power is reduced than if they were assigned IDs in the conventional manner. For example, notice that the physical distance between devices 1 on channels 0 and 2 is maximized by having device 1 for channel 0 appear on the upper left portion of the front face of the module, while device 1 for channel 2 appears on the bottom right portion (as viewed in the Figure). Similar arrangements are made for the other devices. In this example, if the corresponding devices must appear on the same side of a module, then device IDs are assigned so as to maximize the physical distance between the devices.

It will be appreciated that the above examples manipulate the manner in which the device IDs are assigned so that corresponding devices are physically arranged to mitigate power dissipation issues. It will be appreciated that an equivalent, but less preferred way to accomplish this task would be to initialize the devices as has been done in the past but place the burden of managing reading and writing to different physically located devices on the memory controller. For example, in order to reduce the heat flux, the memory controller might contain a mapping algorithm that defines corresponding devices to be device 0 on channel 0 on the front face of the module and device 3 on channel 1 on the back side of module. Thus, when operating the module in lock-step, the memory module would be configured to know which devices are corresponding devices, even though the corresponding devices have different device IDs. The reason that this is less preferred is that it places more processing burden on the memory controller, possibly affecting performance.

Dual In-Line Memory Embodiment

In the above examples, localized hot spots on the memory modules were distributed by rearranging the device IDs in a manner such that the individual corresponding devices were either or both of: (1) placed on different sides of the module, or (2) physically separated on the same side of the module as far away from each other as possible. This rearrangement grew out of the operational nature of the memory modules in that at any one time, only one device (as specified by its device ID) is ever actively being read from or written to. There are memory embodiments where this is not true. That is, in some memory embodiments, multiple devices are active at substantially the same time when reading and writing takes place.

Figure 6:
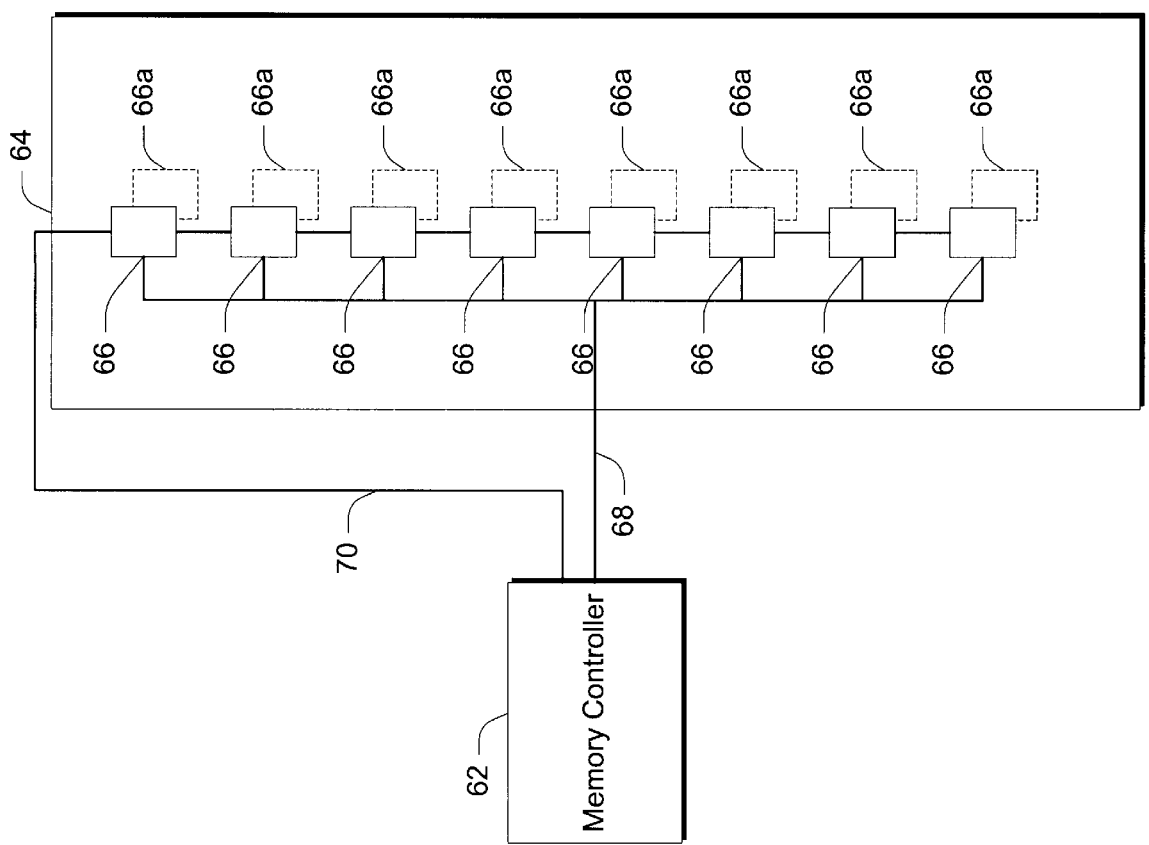
FIG. 6 is a block diagram of an exemplary memory system.

Consider, for example, FIG. 6 which shows a dual in-line module (DIMM) that includes a memory controller 62 and a memory module 64. This particular memory module 64 provides a 64-bit data path width by including, on each side of the module, eight DRAM devices. Exemplary DRAM devices on the front side of the module are designated at 66, while the DRAM devices on the back side of the module are designated at 66a. A 64-bit data bus 68 connects the memory controller with each device 66, 66a. Each DRAM device contributes 8 bits, thus providing the 64-bit data path width. A control line 70 is connected between the memory controller 62 and each device on memory module 64. Control information is routed to all of the DRAM devices by virtue of the control line 70. Responsive to control information routed by the control line 70, each of devices 66 (or 66a) are going to have to respond because they each provide eight bits. Where, as here, there is a two-sided module, the worst case power scenario occurs when only one side of the module is repeatedly accessed for reading or writing. That is, if all of the DRAMs on one side of the module keep getting read from or written to over and over, they can get fairly hot.

Figure 7:
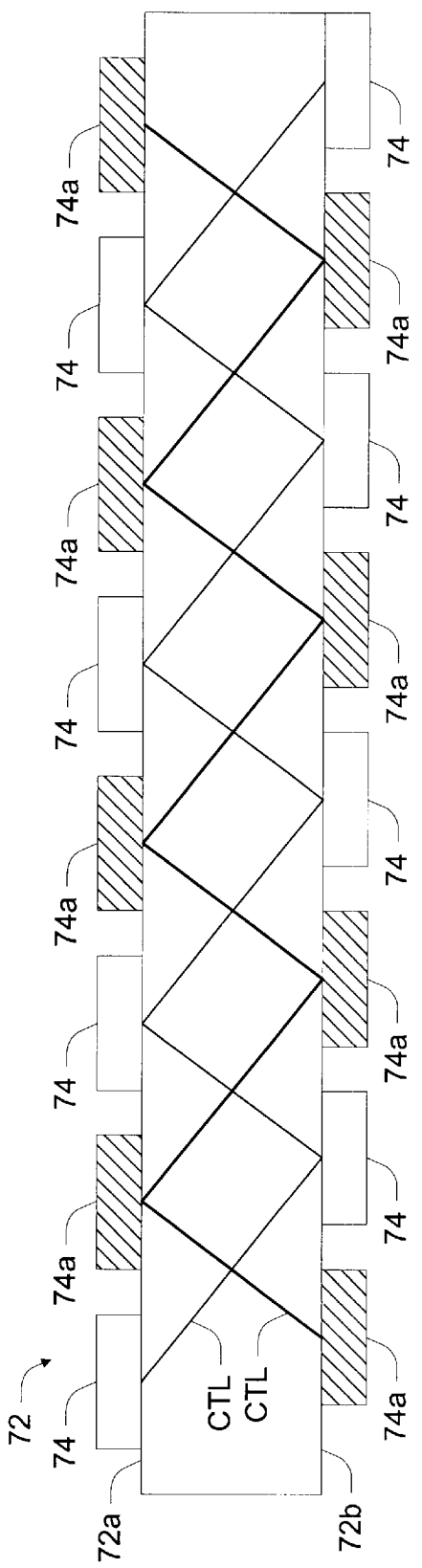
FIG. 7 is a block diagram of a memory module in accordance with one or more of the described embodiments.

FIG. 7 shows top plan view of an exemplary memory module 72 having a front side or face 72a and a back side or face 72b. Each side is configured with multiple devices 74, 74a (i.e. DRAMs). In this particular example, each side of the module contains eight devices. In this example, the control line is alternately routed between devices on different sides of the module 72. Specifically, the control line is routed between devices 74. Notice that four of devices 74 are disposed on side 72a of the module, and four of devices 74 are disposed on side 72b. Similarly, four of devices 74a are disposed on side 72a of the module, and four of devices 74a are disposed on side 72b. Each of devices 74, 74a contribute eight bits to the 64-bit data path width. Devices 74 collectively contribute 64 bits, while devices 74a collectively contribute 64 bits. The control line is seen to be routed through the module and connects to devices on opposite sides of the module. Thus, 32 bits are contributed to the 64-bit data path width by four of the devices on one side of the module, while 32 bits are contributed to the 64-bit data path width by four device on the other side of the module. Accordingly, if one group of devices is repeatedly read from or written to, the localized hot spots are distributed across the faces of the module, with half appearing on one side, and half appearing on the other side. This, in turn, drops the maximum worst-case heat flux that can ever be generated.

Figure 8:
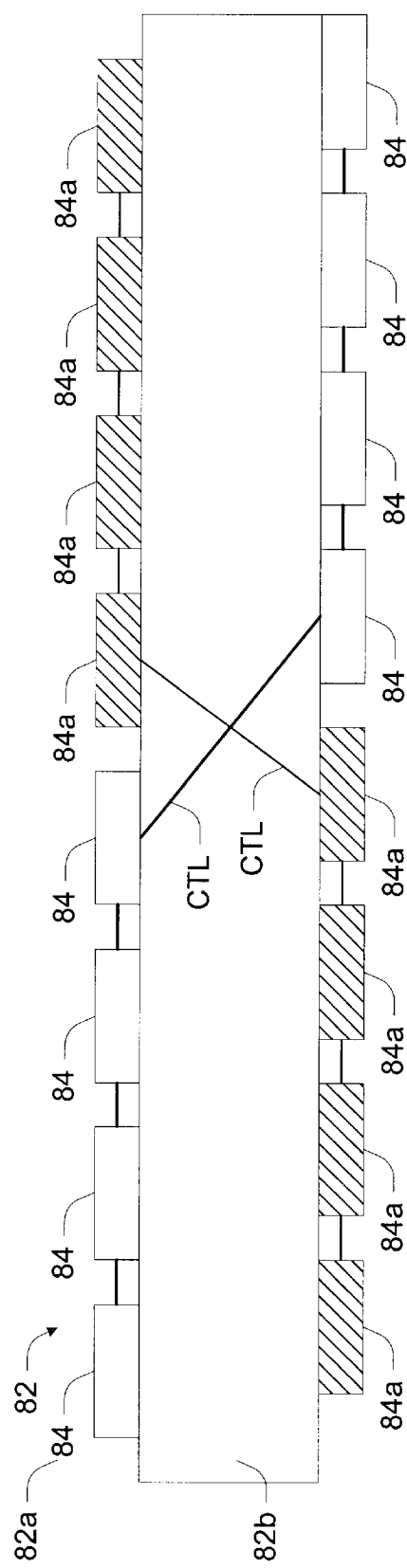
FIG. 8 is a block diagram of a memory module in accordance with one or more of the described embodiments.

FIG. 8 shows another memory module 82 having a front side 82a and a back side 82b. Each side has multiple devices 84, 84a. In this example, a control line is routed between devices on opposite sides of the memory module so that 32 bits of the 64 bit data path width are contributed by four devices on one side of the memory module, while 32 bits are contributed by four devices on the other side of the module. In this example, more than one device through which the control line runs is disposed adjacent another device through which the control runs, where adjacent devices commonly contribute bits to the data path width.

Note that FIGS. 7 and 8 constitute exemplary constructions and are not intended to limit the claimed subject matter to the specific constructions shown. As such other constructions are possible. For example, constructions are possible in which all of the devices on a module are corresponding devices in that they commonly contribute bits to the data path width. Yet, these corresponding devices can be distributed on both faces or sides of the module. Any suitable number of corresponding devices is possible.

Conclusion

The inventive approaches described above are advantageous in that the heat flux for a memory module can be reduced. This is desirable because, in some cases, systems can be cooled with passive cooling techniques such as convection, rather than with active cooling from fans. In addition, the techniques described herein require no changes or modifications in the typical DRAM structure or module (except for, perhaps, some control line routing in those embodiments where it is applicable).

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

What is claimed is:

1. A memory module comprising:
   one or more faces;
   multiple channels on one or more of the faces;
   multiple memory devices on each channel, the memory devices being configured for operation in lock-step; and
   device IDs for each device, the device IDs being arranged so that power dissipation per face is minimized.

2. The memory module of claim 1, wherein the memory devices are disposed on each of the faces of the module.

3. The memory module of claim 1, wherein corresponding devices on each channel are assigned the same device ID.

4. The memory module of claim 1, wherein corresponding devices on each channel are not assigned the same device ID.

5. The memory module of claim 1, wherein corresponding devices on each channel are assigned the same device ID, the device IDs being arranged to maximize the physical distance between corresponding devices.

6. The memory module of claim 5, wherein the physical distance between corresponding devices is maximized on a per face basis, where corresponding devices can appear on the same face of the module.

7. The memory module of claim 1, wherein corresponding devices on each channel are assigned the same device ID, the device IDs being arranged so that corresponding devices are on different faces of the module.

8. The memory module of claim 1, wherein corresponding devices on each channel are assigned the same device ID, the device IDs being arranged: (1) to maximize the physical distance between corresponding devices; and (2) so that corresponding devices are on different faces of the module.

9. The memory module of claim 8, wherein all corresponding devices are on different faces of the module.

10. The memory module of claim 1, wherein the module comprises at least four channels.

11. A memory system comprising:
    one or more memory modules, each of which comprising:
      one or more faces;
      multiple channels on one or more of the faces; and
      multiple memory devices on each channel, the memory devices being configured for operation in lock-step; and
    a memory controller operably connected with the one or more memory modules, the memory controller being configured to assign device IDs for each device, the device IDs being arranged so that power dissipation per face is minimized.

12. The memory system of claim 11 comprising multiple memory modules, wherein corresponding devices on different channels share the same device ID, at least some of the corresponding devices be disposed on different modules.

13. The memory system of claim 11, wherein corresponding devices that are operated in lock step on each channel are assigned the same device ID.

14. The memory system of claim 11, wherein corresponding devices is that are operated in lock step on each channel are not assigned the same device ID.

15. The memory system of claim 11, wherein corresponding devices that are operated in lock step on each channel are not assigned the same device ID, the memory controller being configured to manage which memory devices are corresponding devices.

16. A memory module comprising:
    one or more faces;
    multiple channels on one or more of the faces;
    multiple DRAM devices on each channel, the DRAM devices being configured for operation in lock-step; and
    device IDs for each DRAM device, corresponding DRAM devices on different channels having the same device ID, the device IDs being arranged so that no two DRAM devices have the same device ID on any one face.

17. The memory module of claim 16, comprising two or more DRAM devices on each channel.

18. The memory module of claim 16, comprising four or more DRAM devices on each channel.

19. The memory module of claim 16, comprising four or more DRAM devices on each face.

20. The memory module of claim 16, comprising eight or more DRAM devices on each module.

21. The memory module of claim 16, comprising DRAM devices on each face.

22. A memory system comprising:
one or more memory modules, each of which comprising:
one or more faces;
multiple channels on one or more of the faces; and
multiple DRAM devices on each channel, the DRAM devices being configured for operation in lock-step; and
a memory controller operably connected with the one or more memory modules, the memory controller being configured to assign device IDs for each DRAM device, corresponding DRAM devices on different channels having the same device ID, the device IDs being arranged so that no two DRAM devices have the same device ID on any one face of a memory module.

23. A memory module comprising:
one or more faces;
multiple channels on one or more of the faces;
multiple DRAM devices on each channel, the DRAM devices being configured for operation in lock-step; and
device IDs for each DRAM device, corresponding DRAM devices on different channels having the same device ID, the device IDs being arranged so that the physical distance between corresponding devices on a face is maximized.

24. The memory module of claim 23, wherein corresponding DRAM devices are disposed on different faces.

25. The memory module of claim 23, wherein all corresponding DRAM devices are disposed on different faces.

26. The memory module of claim 23, comprising two or more DRAM devices on each channel.

27. The memory module of claim 23, comprising four or more DRAM devices on each channel.

28. The memory module of claim 23, comprising four or more DRAM devices on each face.

29. The memory module of claim 23, comprising eight or more DRAM devices on the module.

30. The memory module of claim 23, comprising DRAM devices on each face.

31. A memory system comprising:
one or more memory modules, each of which comprising:
one or more faces;
multiple channels on one or more of the faces; and
multiple DRAM devices on each channel, the DRAM devices being configured for operation in lock-step; and
a memory controller device operably connected with the one or more memory modules, the memory controller being configured to assign device IDs for each DRAM device, corresponding DRAM devices on different channels having the same device ID, the device IDs being arranged so that the physical distance between corresponding devices is maximized.

32. A memory module comprising:
one or more faces;
multiple channels on one or more of the faces;
multiple memory devices on each channel, the memory devices being configured for operation in lock-step; and
device IDs for each memory device, corresponding memory devices on different channels having the same device ID, wherein there are enough memory devices so that at least one pair of corresponding devices have to appear on the same face, the device IDs being arranged so that the physical distance between corresponding devices on a face is maximized.

33. The memory module of claim 32, comprising four or more devices on a channel.

34. The memory module of claim 32, comprising four or more channels.

35. The memory module of claim 34, comprising four or more devices on a channel.

36. A memory system comprising:
one or more memory modules, each of which comprising:
one or more faces;
multiple channels on one or more of the faces; and
multiple memory devices on each channel, the memory devices being configured for operation in lock-step; and
a memory controller device operably connected with the one or more memory modules, the memory controller being configured to assign device IDs for each memory device, corresponding memory devices on different channels having the same device ID, wherein there are enough memory devices so that at least one pair of corresponding devices have to appear on the same face, the device IDs being arranged so that the physical distance between corresponding devices on a face is maximized.

37. A memory module comprising:
front and back faces;
one or more device on each face;
a control line connecting devices on each of the faces so that the connected devices commonly contribute multiple bits to a data bus.

38. The memory module of claim 37, wherein all of the multiple devices are corresponding devices that commonly contribute multiple bits to a data bus.

39. The memory module of claim 37, wherein the control line alternates between devices on each of the faces.

40. The memory module of claim 37, wherein the control line connects multiple devices on both the front and back face.

41. The memory module of claim 40, wherein at least some of the connected devices on a face are disposed adjacent one another.

42. The memory module of claim 37, comprising four or more devices on a face.

43. The memory module of claim 37, comprising at least eight devices per module.

44. The memory module of claim 37, wherein the devices comprise DRAMs.

* * * * *